(12) United States Patent
Hattori

(10) Patent No.: US 7,556,916 B2
(45) Date of Patent: *Jul. 7, 2009

(54) METHOD FOR BURYING RESIST AND METHOD FOR MANUFACTURING SEMICONDUCTOR DEVICE

(75) Inventor: Sachiko Hattori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/935,487

(22) Filed: Nov. 6, 2007

(65) Prior Publication Data

US 2008/0070415 A1    Mar. 20, 2008

Related U.S. Application Data

(63) Continuation of application No. 10/676,090, filed on Oct. 2, 2003, now Pat. No. 7,312,017.

(30) Foreign Application Priority Data

Oct. 4, 2002    (JP)  ............................... 2002-291823

(51) Int. Cl.
     *H01L 21/302*    (2006.01)
     *H01L 21/461*    (2006.01)

(52) U.S. Cl. ........................ 430/313; 430/311; 438/703; 438/690

(58) Field of Classification Search ................... None
See application file for complete search history.

(56) References Cited

U.S. PATENT DOCUMENTS

| 5,792,680 | A | 8/1998 | Sung et al. |
| 6,100,177 | A | 8/2000 | Noguchi |
| 6,146,968 | A | 11/2000 | Lu et al. |
| 6,287,955 | B1 | 9/2001 | Wang et al. |
| 6,645,851 | B1 | 11/2003 | Ho et al. |
| 7,312,017 | B2 * | 12/2007 | Hattori ........................ 430/311 |
| 2004/0077170 | A1 | 4/2004 | Hattori |

FOREIGN PATENT DOCUMENTS

| CN | 1009687 A | 3/1987 |
| JP | 8-204150 | 8/1996 |
| JP | 9-321046 | 12/1997 |
| JP | 2002-100553 | 4/2002 |

* cited by examiner

*Primary Examiner*—John A McPherson
*Assistant Examiner*—Daborah Chacko Davis
(74) *Attorney, Agent, or Firm*—Leydig, Voit & Mayer, Ltd.

(57) ABSTRACT

A resist film is applied to an entire surface and subjected to patterning substantially in the same form as an opening to bury the resist film inside the opening. When a positive resist is used, a photomask having a light-shielding portion with an area smaller than the opening is used in patterning. When a negative resist is used, a photomask having a light transmitting portion with an area smaller than the opening is used.

2 Claims, 13 Drawing Sheets

METHOD FOR BURYING RESIST AND METHOD FOR MANUFACTURING SEMICONDUCTOR DEVICE

CROSS REFERENCE TO RELATED APPLICATIONS

This application is a continuation of U.S. patent application No. 10/676,090, filed on Oct. 2, 2003, which is incorporated herein by reference.

BACKGROUND OF THE INVENTION

1. Field of the Invention

The present invention relates to a method for manufacturing a semiconductor device, and more particularly, to a method for protecting the bottom of an opening against processing in a subsequent step in the formation of a capacitor or in a dual Damascene process.

2. Background Art

For protecting the bottom of an opening, a method has been conventionally adopted wherein where a cylindrical capacitor of a semiconductor is, for example, formed, an opening is formed in an oxide film, after which a film, such as polysilicon, is formed over the whole surface and an organic film, such as a resist, is formed by a coating method and exposure is effected so that the resist film is left as an etching mask only at the bottom of the opening, thereby protecting the polysilicon film, followed by etching back to remove the region other than the polysilicon inside the opening (e.g., see Japanese Patent Laid-open No. Hei 8-204150 (page 4, FIG. 1)).

In the conventional method of protecting the bottom of an opening of a semiconductor device, a positive photoresist is used for an organic film employed as a protecting material and is subjected to whole surface exposure to completely remove the resist from the upper portion of the opening through exposure and development. Because exposure light does not arrive at the bottom of the opening, the resist is left thereat, which is used to realize the protection of the polysilicon film at the bottom of the opening. Similar effects are obtained using, for another method, a method wherein an organic film, such as a resist, is applied and subsequently etched back.

However, these methods have the problems that if the resist at the bottom of the opening is left where aspect ratio of the opening is small, i.e., where the depth of the opening is small or area of the opening is large, the resist on the upper portion of an insulating film around the opening may also be left, or the resist at the bottom of the opening may be undesirably removed if the resist on the upper portion of the insulating film is removed.

SUMMARY OF THE INVENTION

The invention has been made in order to overcome such problems as set out above and contemplates to provide a method for burying a resist and a method for manufacturing a semiconductor device wherein a resist can be buried only at the bottom irrespective of the structures such as a groove pattern or a hole pattern, enabling a protecting film to be formed for a subsequent step.

According to one aspect of the present invention, in a method for burying a resist, an interlayer film is formed on a substrate. An opening is formed in the interlayer film. A resist film is coated onto the interlayer film including the opening. The resist film is patterned substantially in the same form as the opening, thereby is buried the resist film in the inside of the opening.

According to another aspect of the present invention, in a method for burying a resist, an interlayer film is formed on a substrate. An opening is formed in the interlayer film. Another film is formed on the interlayer film including the opening. A resist film is coated on another film. The resist film is patterned substantially in the same form as the opening, thereby is buried the resist film in the inside of the opening.

According to other aspect of the present invention, in a method for manufacturing a semiconductor device, an interlayer film is formed on a substrate. An opening is formed in the interlayer film. A resist film is coated on the interlayer film including the opening. The resist film is patterned substantially in the same form as the opening, thereby is buried the resist film in the inside of the opening. The interlayer film is etched while masking a bottom portion of the opening with the resist film buried in the opening.

According to further aspect of the present invention, in a method for manufacturing a semiconductor device, an interlayer film is formed on a substrate. An opening is formed in the interlayer film. Another film is coated on the interlayer film including the opening. A resist film is coated on another film. The resist film is patterned substantially in the same form as the opening, thereby is buried the resist film in the inside of the opening. Another film is etched while masking a bottom portion of the opening with the resist film buried in the opening.

Other and further objects, features and advantages of the invention will appear more fully from the following description.

DETAILED DESCRIPTION OF THE PREFERRED EMBODIMENTS

First Embodiment

Figure 1:
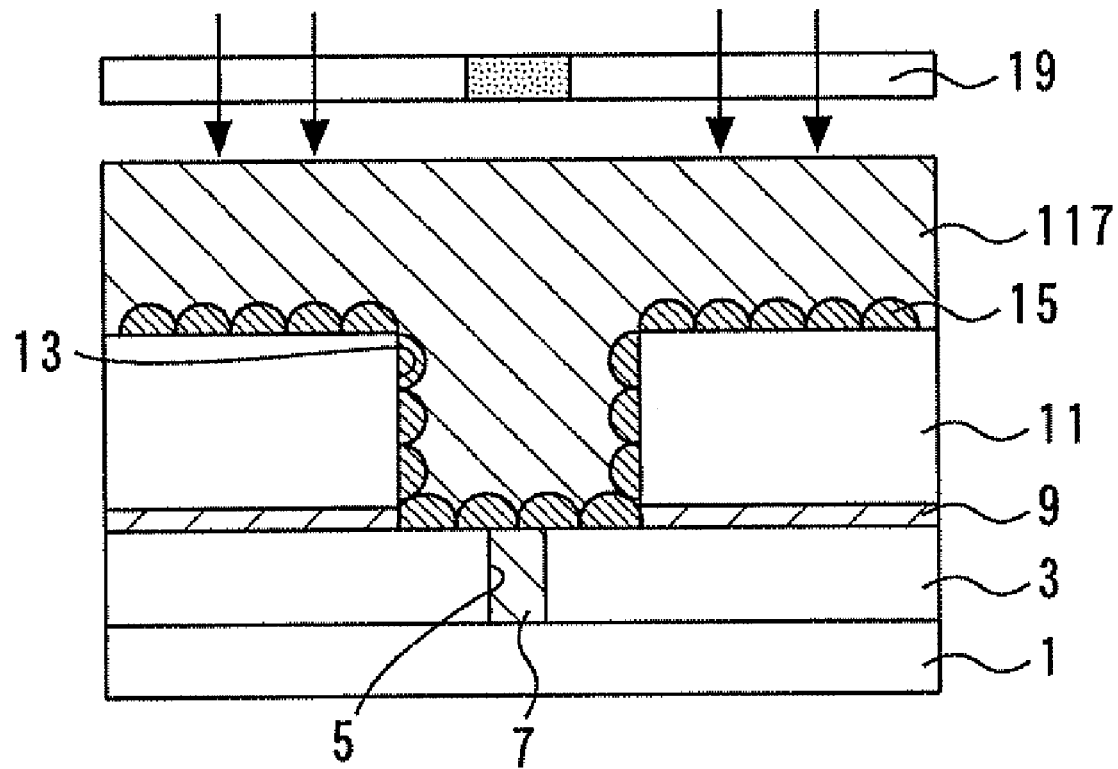
FIG. 1 is a cross section showing a capacitor formation process of a semiconductor device according to the first embodiment.

FIGS. 1 to 5 are, respectively, a schematic sectional view showing a process of manufacturing a semiconductor device according to a first embodiment of the invention. It will be noted that like reference numerals indicate like parts or portions throughout the drawings used in the embodiments described hereinafter and are not repeatedly illustrated.

Referring now to FIG. 1, like prior art techniques, a first insulating film 3, a connection hole 5, a polysilicon plug 7, a second insulating film 9, a third insulating film 11, an opening 13, and a polysilicon film 15 are formed on a semiconductor substrate 1. After the polysilicon film 15 is roughened on the surface thereof, a positive photoresist 117 is applied onto the polysilicon film 15 containing the opening 13, followed by exposure and development of the photoresist film 117 by use of a photomask 19 whose light-shielding portion is smaller than the opening 13 so that the photoresist film 117 is left inside the opening 13 and the photoresist film 117 is removed at portions other than the opening 13. In the present invention, 'the resist film is patterned substantially in the same form as the opening' means that an opening of photoresist film 117 developed is the same form as the opening 13.

Figure 2:
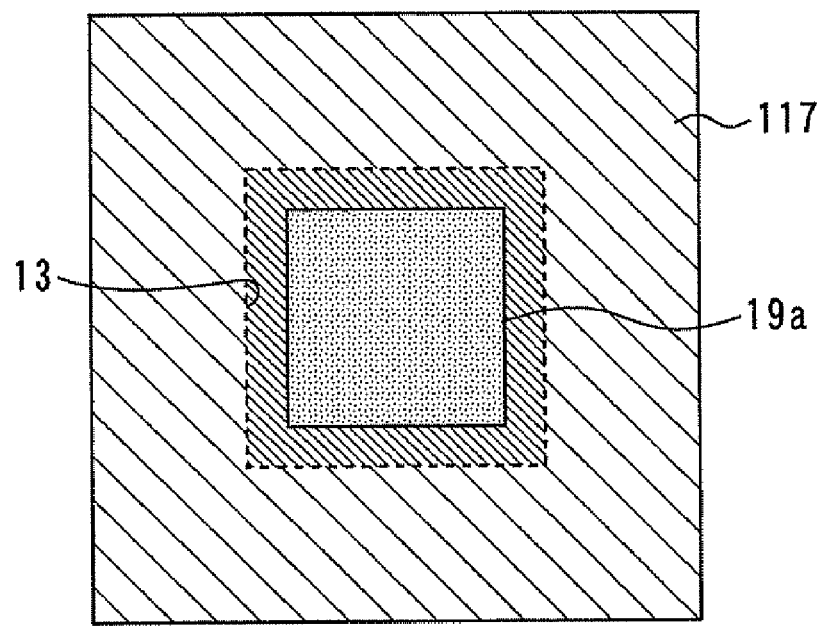
FIG. 2 is a top view showing a capacitor formation process of a semiconductor device according to the first embodiment.

FIG. 2 is a schematic view in case where FIG. 1 is seen from above. A light-shielding portion 19a of the photomask 19 has a region smaller than the opening 13. In case of a reduction projection exposure, the light-shielding portion 19a is a light-shielding portion projected on a wafer.

Figure 3:
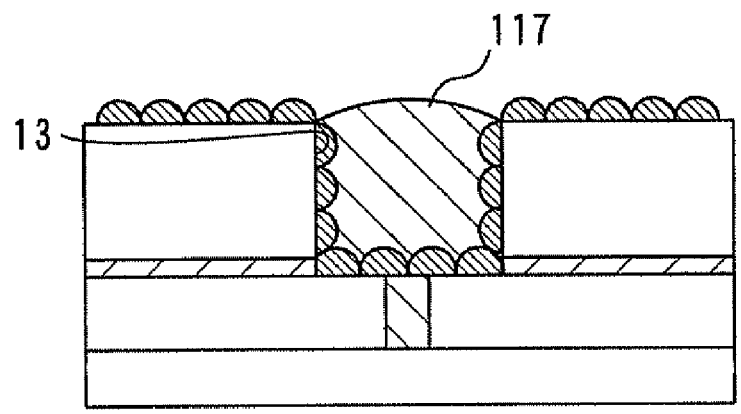
FIG. 3 is a cross section showing a capacitor formation process of a semiconductor device according to the first embodiment.

Next, referring to FIG. 3, the resist film 117 at the opening is left without removal after development.

Figure 4:
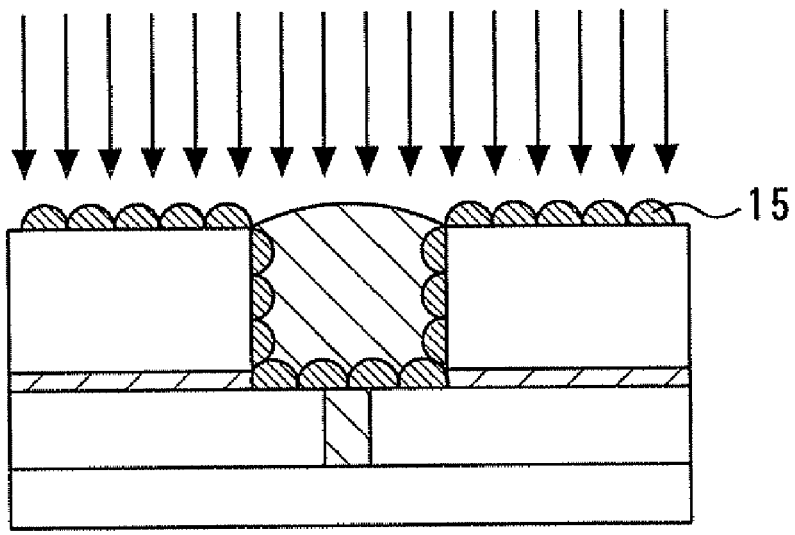
FIG. 4 is a cross section showing a capacitor formation process of a semiconductor device according to the first embodiment.

With reference to FIG. 4, a chlorine-based gas is used to etch back the polysilicon film 15.

Figure 5:
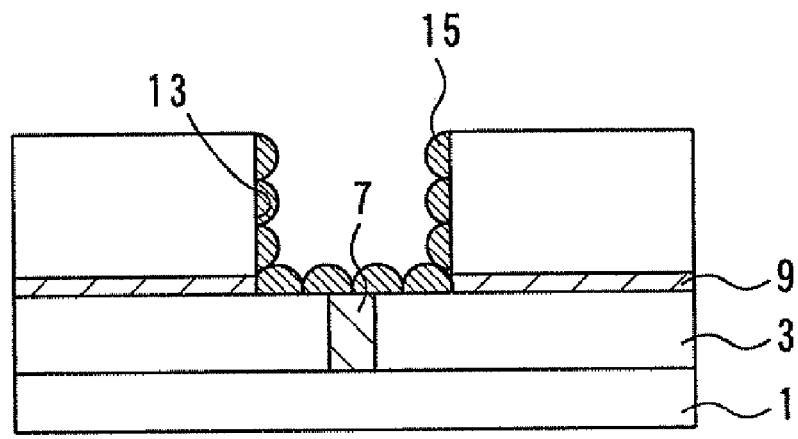
FIG. 5 is a cross section showing a capacitor formation process of a semiconductor device according to the first embodiment.

Next, referring to FIG. 5, the polysilicon film 15 is removed by etching from the third insulating film 11 except the inside of the opening 13, after which the resist is removed to form, only within the opening 13, the polysilicon film 15 serving as a capacitor electrode.

Subsequently, a given process is carried out to complete a semiconductor device.

As described hereinabove, according to the invention relating to the first embodiment, even if the opening is deep or the opening is large in area, the resist on the polysilicon within the opening is left by use of a positive photoresist and the resist on the polysilicon film around the opening can be removed, thus making it possible to improve the reliability of the capacitor electrode forming process and the stability in yield of a semiconductor device irrespective of the structure of the opening.

Second Embodiment

In the first embodiment, the polysilicon film serving as a capacitor electrode has been formed only within the opening by exposing the positive photoresist to light through a photomask whose a light-shielding portion is smaller than the opening and leaving the resist film at the opening without removal after development. In contrast, according to a second embodiment, a negative type resist film is exposed to light through a photomask whose the light-transmitting portion is smaller than the opening and the resist film is removed at portions thereof other than the opening after development while leaving the resist film at the opening without removal after the development, thereby forming a polysilicon film serving as a capacitor electrode only within the opening. In the case of a reduction projection exposure, the light-transmitting portion is a portion projected on a wafer.

Figure 6:
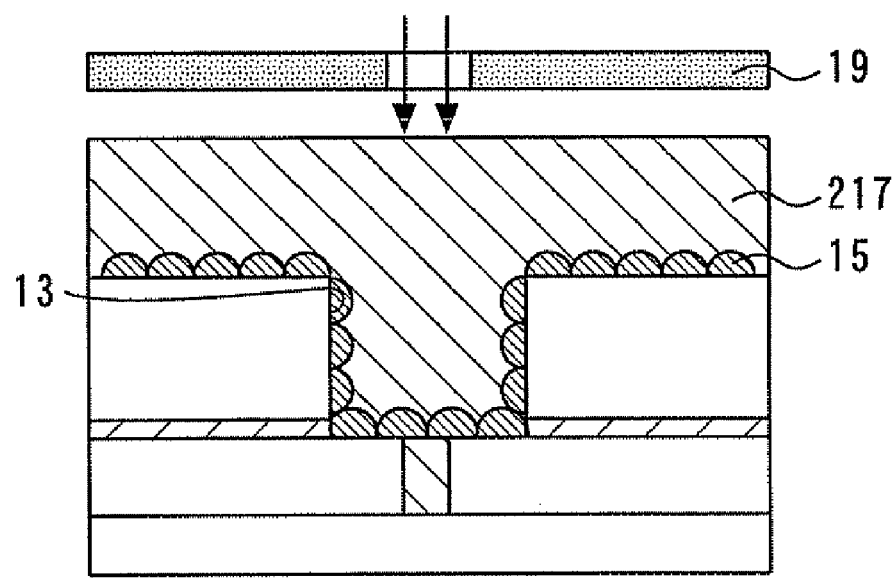
FIG. 6 is a cross section showing a capacitor formation process of a semiconductor device according to the second embodiment.

FIG. 6 is a schematic sectional view showing the step of manufacturing a semiconductor device according to the second embodiment of the invention.

With reference to FIG. 6, like the first embodiment, a first insulating film 3, a first connection hole 5, a polysilicon plug 7, a second insulating film 9, a third insulating film 11, an opening 13 and a polysilicon film 15 are formed on a semiconductor substrate 1. After roughening the polysilicon film 15 on the surface thereof, a negative photoresist 217 is applied onto the polysilicon film 15 including the opening 13, followed by exposure and development of the photoresist film 217 by use of a photomask 19 having a light-transmitting portion, which is smaller than the opening 13, in such a way that the photoresist film 217 is left within the opening 13 and the portions of the photoresist film 217 other than the opening 13 are removed.

Like the first embodiment, the polysilicon film 15 is subsequently removed from the third insulating film 11 except the inside of the opening 13 to form the polysilicon film 15 serving as a capacitor electrode only within the opening 13, followed by a given process to complete a semiconductor device.

As stated hereinabove, according to the invention relating to the second embodiment, even if the depth of the opening is small or the opening has a large area, the resist on the polysilicon film within the opening can be left by use of a negative type resist and the resist can be removed from the upper portion of the polysilicon film in the vicinity of the opening. Thus, it becomes possible to improve the reliability of the capacitor electrode-forming process and the stability in yield of the semiconductor device irrespective of the structure of the opening.

Third Embodiment

In this embodiment, the method of manufacturing a semiconductor device of the invention is applied to the fabrication of a semiconductor memory device having a capacitor.

FIGS. 7 to 15 are, respectively, a schematic sectional view showing a process of manufacturing a semiconductor device according to the third embodiment of the invention.

Figure 7:
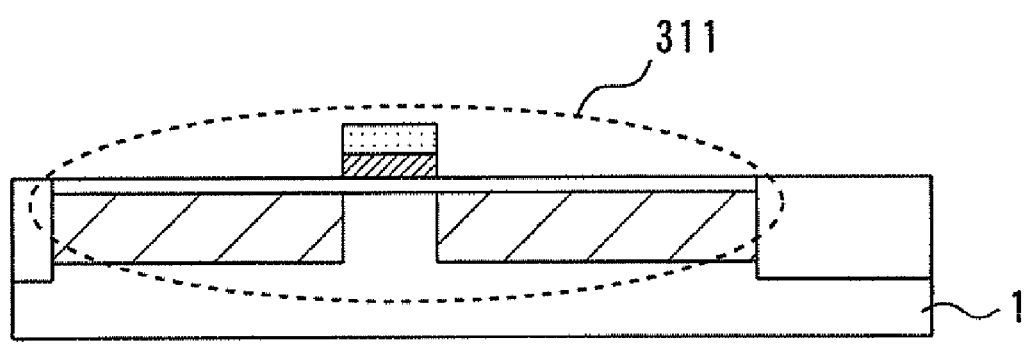
FIG. 7 is a cross section showing a process of manufacturing a semiconductor memory device according to the third embodiment.

With reference to FIG. 7, a field effect transistor 311 is formed on a single crystal silicon substrate 1.

Figure 8:
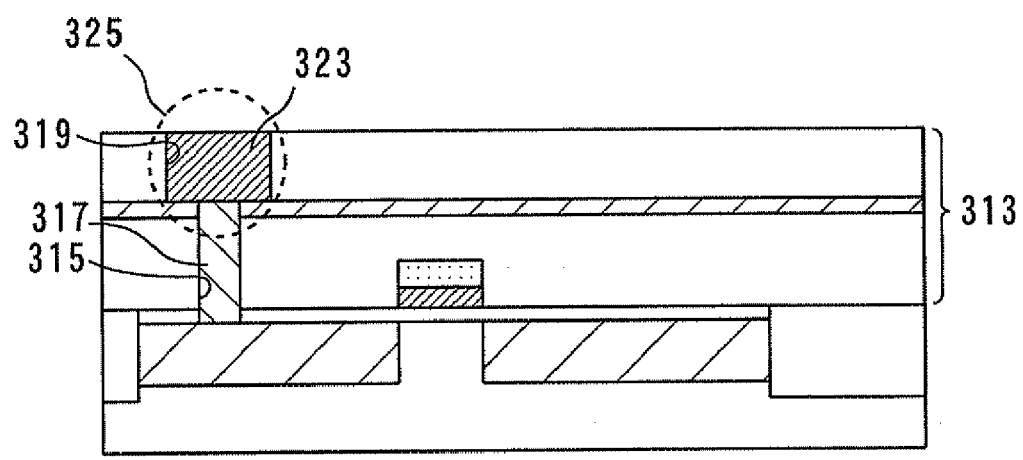
FIG. 8 is a cross section showing a process of manufacturing a semiconductor memory device according to the third embodiment.

Next, referring to FIG. 8, an interlayer insulating film 313 is formed on the field effect transistor using a CVD method or the like, and subjected to resist coating, light exposure and development, followed by a dry etching technique to form a first connection hole 315. A W thin film is formed on the interlayer insulating film 313 by a CVD method, followed by etching back to form a W plug 317 inside the first connection hole 315. Further, after resist coating, light exposure and development, a first groove 319 for a first wiring is formed by a dry etching technique, followed by formation of a first wiring 325 made of a polysilicon film according to a CVD method and a CMP method.

Figure 9:
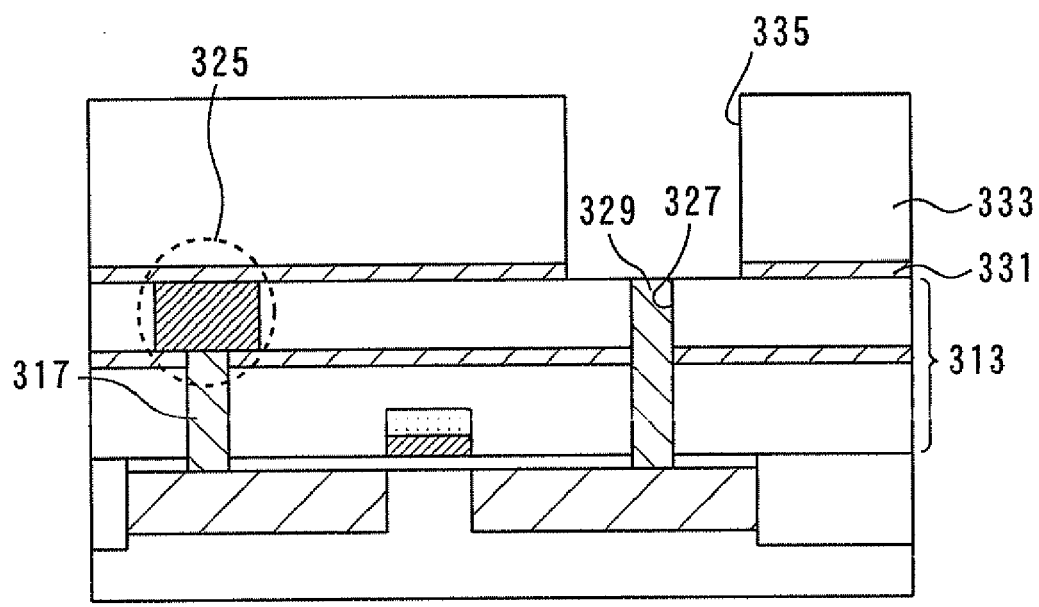
FIG. 9 is a cross section showing a process of manufacturing a semiconductor memory device according to the third embodiment.

Next, with reference to FIG. 9, a resist is applied onto the interlayer insulating film 313 including the first wiring 325 and is exposed to light and developed, after which a second connection hole 327 is formed by a dry etching technique and a polysilicon film is formed by a CVD method, followed by etching back to bury the polysilicon film in the second connection hole 327, thereby forming a polysilicon plug 329. Moreover, a second insulating film 331 made of a 90 nm thick silicon nitride film is formed on the interlayer insulating film 313 including the polysilicon plug 329 by a CVD method or the like, and a third insulating film 333 made of a 300 nm thick silicon oxide film is formed on the second insulating film 331 by a CVD method or the like, followed by resist coating, light exposure and development. Thereafter an opening 335 is formed by a dry etching technique.

Figure 10:
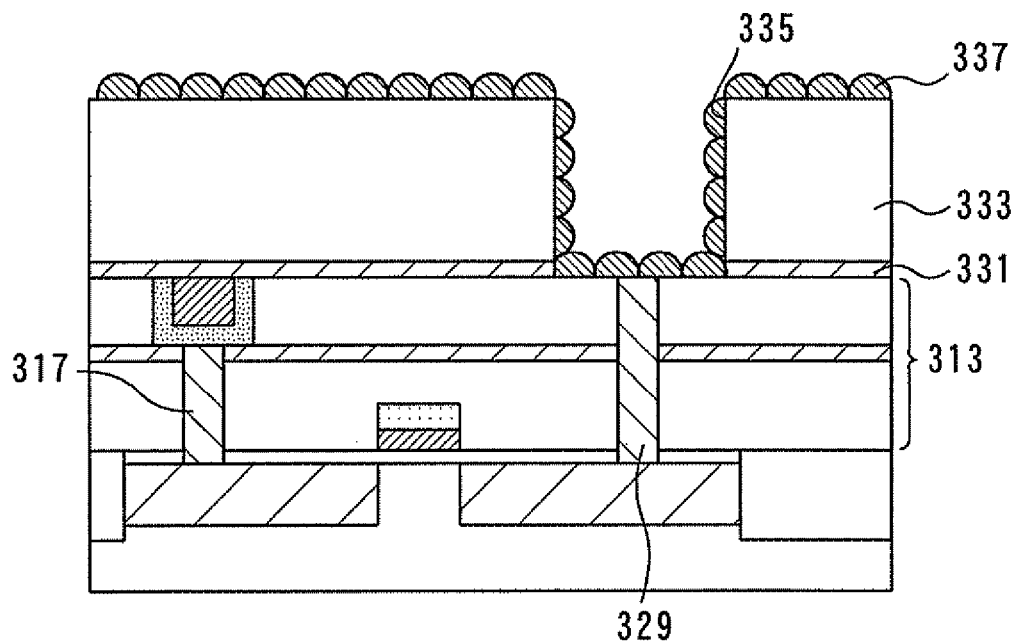
FIG. 10 is a cross section showing a process of manufacturing a semiconductor memory device according to the third embodiment.

Next, with reference to FIG. 10, a 90 nm thick polysilicon film 337 is formed on the third insulating film 333 including the opening 335 by a CVD method or the like. Thereafter, the polysilicon film 337 is roughened on the surface thereof by a selective CVD method in order to increase the surface area thereof.

Figure 11:
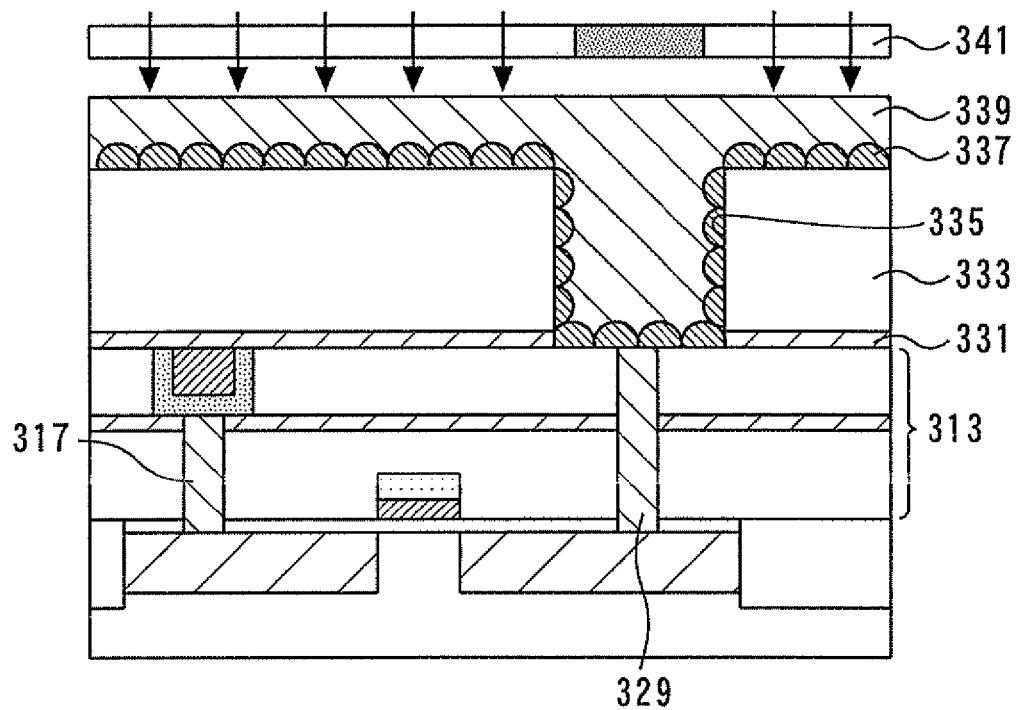
FIG. 11 is a cross section showing a process of manufacturing a semiconductor memory device according to the third embodiment.

Next, referring to FIG. 11, a positive photoresist 339 is coated onto the polysilicon film 337 including the opening 335, and the photoresist film 339 is exposed and developed by use of a photomask 341, which has a light-shielding portion smaller than the opening 335, in such a way that while the photoresist film 339 is left in the inside of the opening 335, the portions of the photoresist film 339 other than the opening 335 are removed.

In this example, although a positive photoresist has been used, it is possible to coat a negative photoresist and subject the photoresist to exposure and development by use of a photomask whose light-transmitting portion is smaller than an opening.

Figure 12:
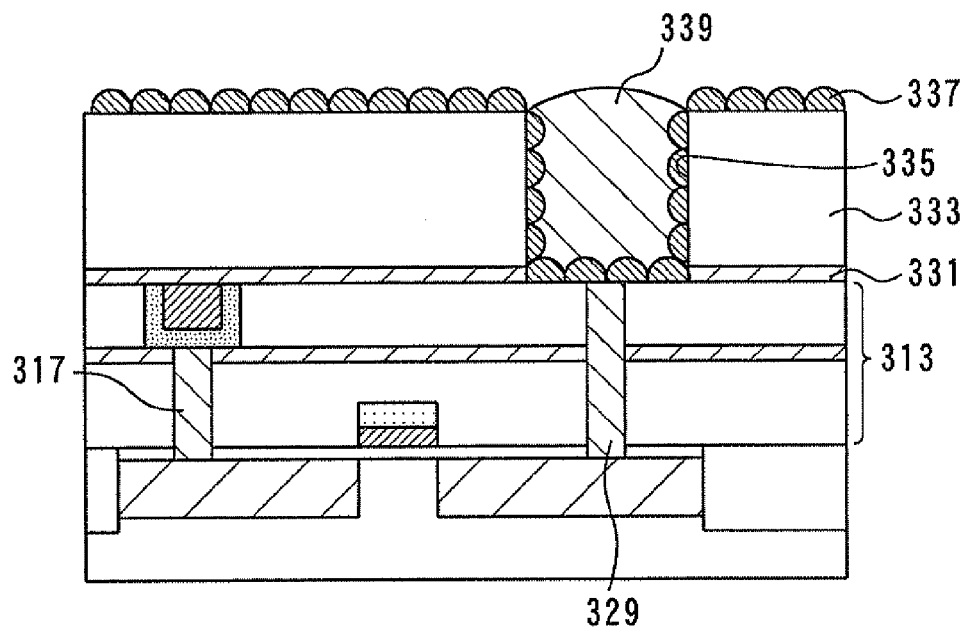
FIG. 12 is a cross section showing a process of manufacturing a semiconductor memory device according to the third embodiment.

Next, with reference to FIG. 12, the resist film 339 inside the opening 335 is left after the development without removal thereof.

Figure 13:
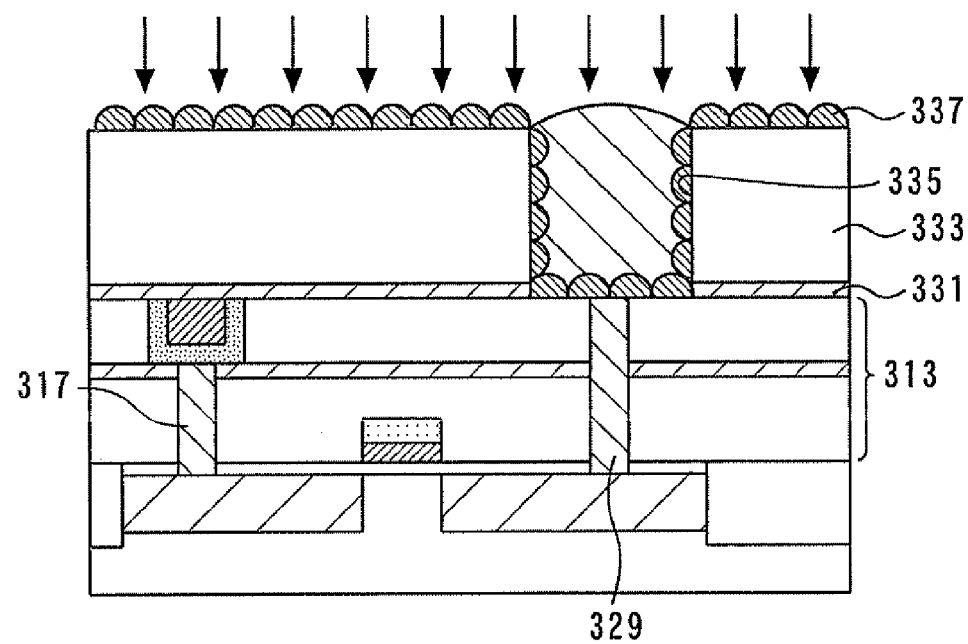
FIG. 13 is a cross section showing a process of manufacturing a semiconductor memory device according to the third embodiment.

Next, with reference to FIG. 13, the polysilicon film 337 is etched back by means of a chlorine-based gas.

Figure 14:
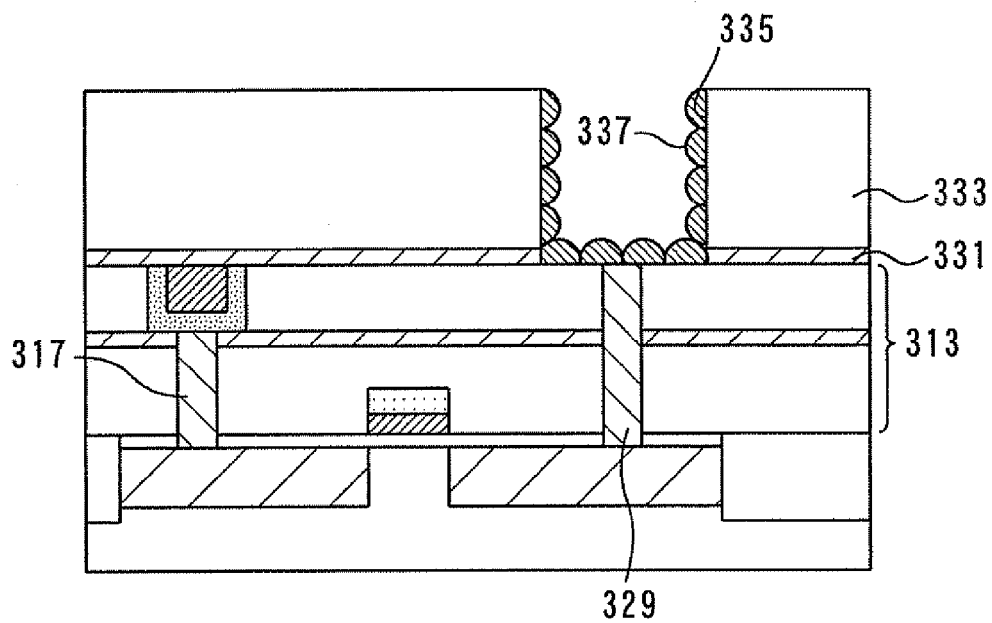
FIG. 14 is a cross section showing a process of manufacturing a semiconductor memory device according to the third embodiment.

Next, with reference to FIG. 14, the polysilicon film 337 is removed by etching from the third insulating film 333, but except the inside of the opening 335, after which the resist 339 left within the opening 335 is removed to form a polysilicon film 337 serving as a capacitor electrode only within the opening 335.

Figure 15:
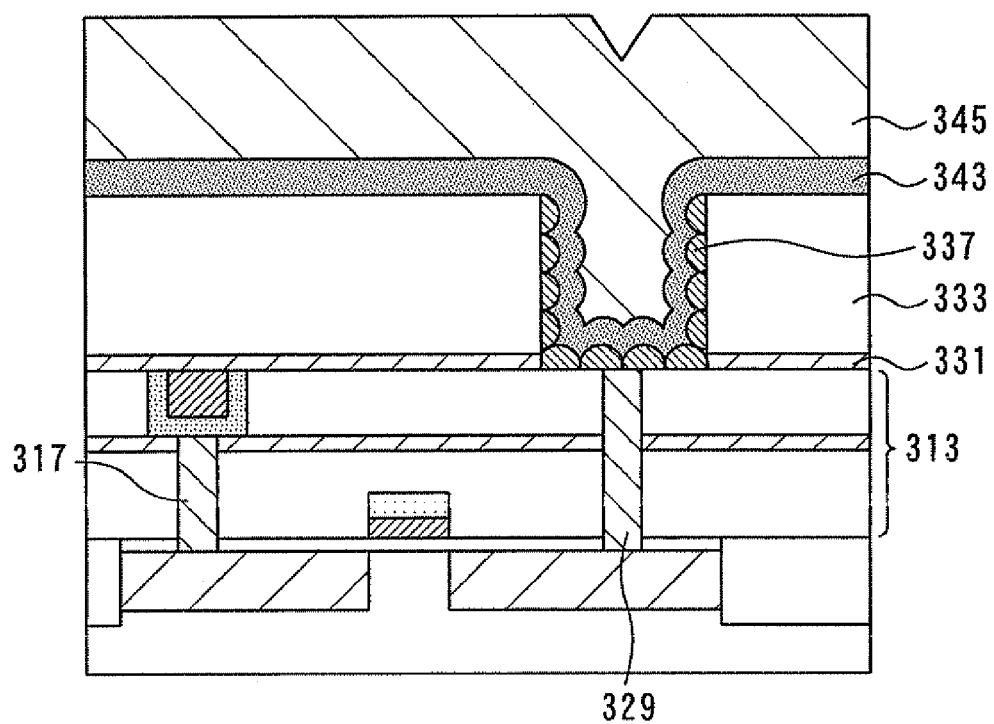
FIG. 15 is a cross section showing a process of a manufacturing semiconductor memory device according to the third embodiment.

Next, referring to FIG. 15, a dielectric film 343 and a cell plate 345 are formed for the formation of a capacitor.

Subsequently, a given process is carried out to complete a semiconductor memory device.

As stated hereinabove, according to the invention relating to the third embodiment, in case where an aspect ratio of an opening is small in the formation of a capacitor electrode in an actual device, a resist on a polysilicon film within an opening can be left while removing the resist from the upper portion of the polysilicon film, thus making it possible to improve the reliability of the capacitor electrode forming process and the stability in yield of a semiconductor device.

Fourth Embodiment

In this embodiment, the method of manufacturing a semiconductor device according to the invention is applied to the manufacture of a semiconductor device having a multi-layered wiring structure.

FIGS. 16 to 25 are, respectively, a schematic sectional view showing a process of manufacturing a semiconductor device according to the fourth embodiment of the invention.

Figure 16:
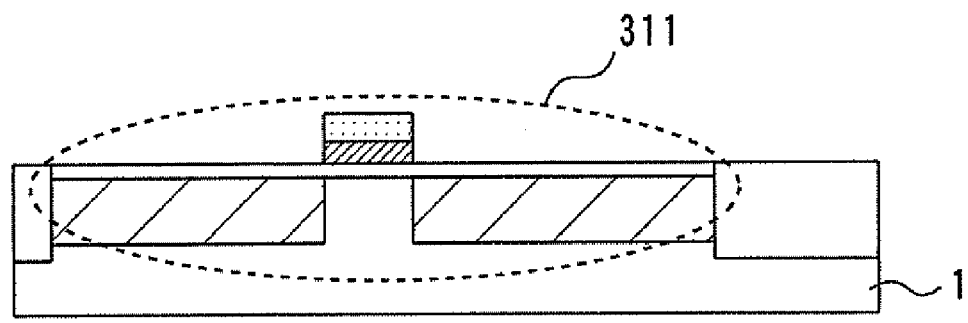
FIG. 16 is a cross section showing a process of manufacturing a field effect transistor according to the fourth embodiment.

Referring to FIG. 16, a field effect transistor 311 is formed on a single crystal silicon substrate 1.

Figure 17:
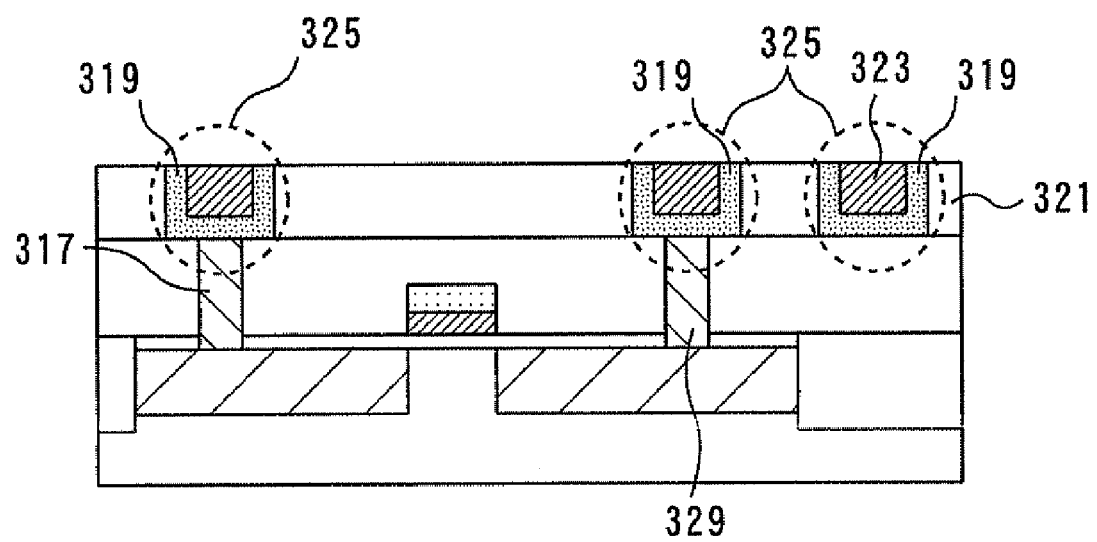
FIG. 17 is a cross section showing a process of manufacturing a field effect transistor according to the fourth embodiment.

Next, with reference to FIG. 17, an interlayer insulating film 313 is formed on the field effect transistor 311 by a CVD method or the like and subjected to resist coating, light exposure and development, followed by formation of a first connection hole 315 by a dry etching technique and further formation of a W plug 317 in the first connection hole 315. Moreover, a second insulating film 331 is formed on the interlayer insulating film 313 and subjected to resist coating, light exposure and development, followed by formation of a first groove 319 for a first wiring by a dry etching technique and further formation of a TaN thin film 321 on the bottom and side walls of the first groove 319 and also on the interlayer insulating film 313 by a sputtering method. After further formation of a copper thin film 323 on the TaN thin film 321 by a CVD method or a plating method, the copper thin film 323 and the TaN thin film 321 are polished by a CMP method to form a first wiring 325, which is made of the TaN thin film 321 as a lower layer and the copper thin film as the upper layer in the inside of the first groove 319.

Figure 18:
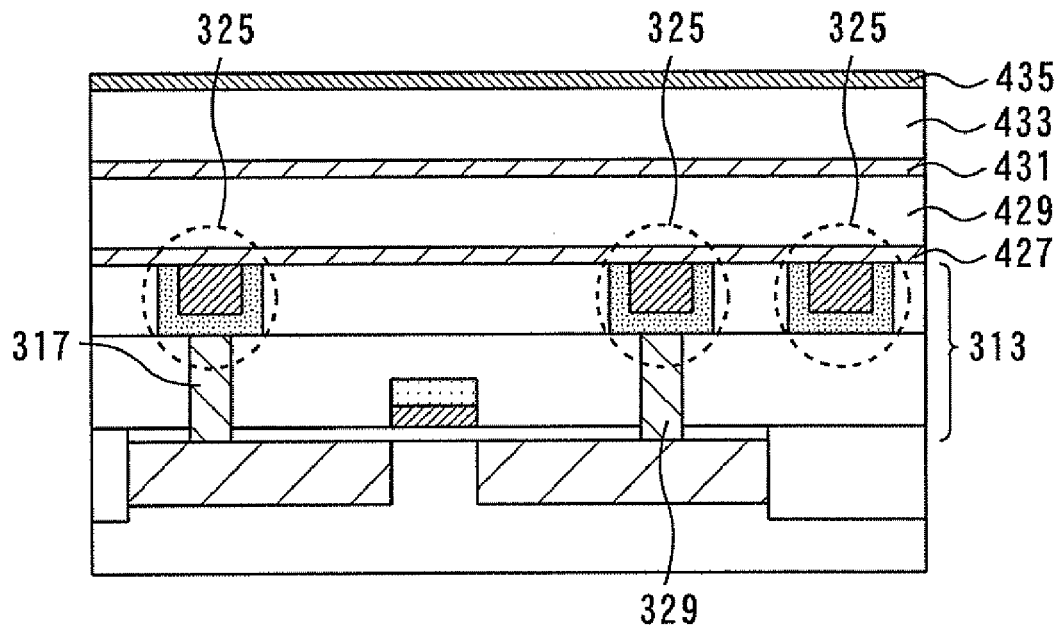
FIG. 18 is a cross section showing a process of manufacturing a field effect transistor according to the fourth embodiment.

Next, with reference to FIG. 18, a third insulating film 427 made of a 60 nm thick silicon nitride film is formed on the interlayer insulating film 313 including the first wiring 325 by a CVD method or the like, and a fourth insulating film 429 made of a 400 nm thick silicon oxide film is formed by a CVD method or the like. A firth insulating film 431 made of a 60 nm thick silicon nitride film is further formed on the fourth insulating film 429 by a CVD method or the like. In addition, a sixth insulating film made of a 300 nm thick silicon oxide film is formed on the fifth insulating film 431 by a CVD method or the like, and a 90 nm thick silicon nitride oxide film is formed on the sixth insulating film 433 as an antireflecting film 435 for patterning by a CVD method or the like.

Figure 19:
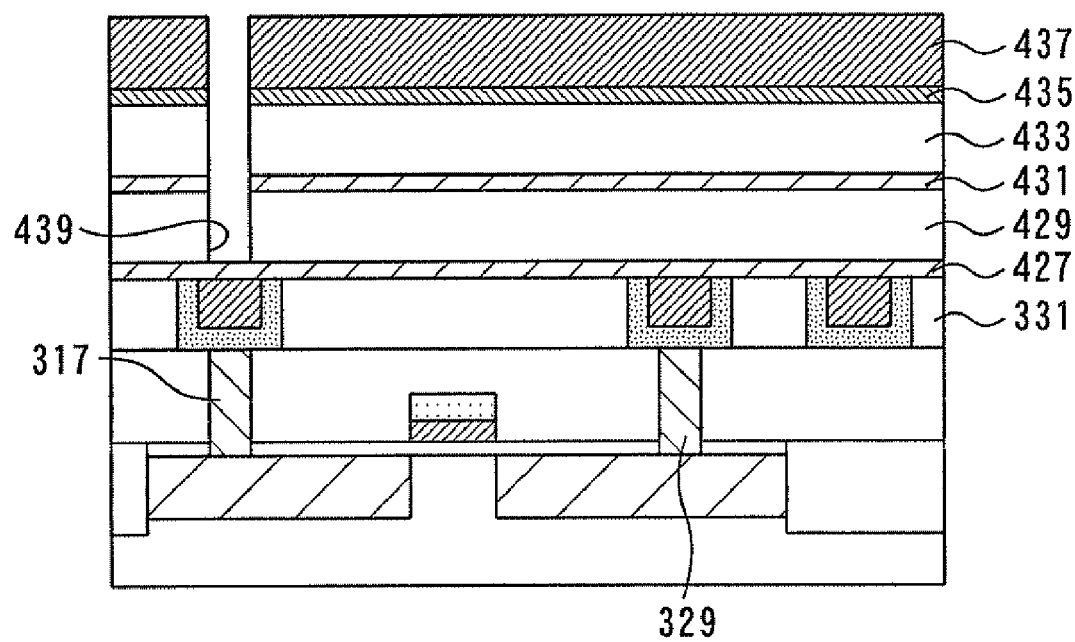
FIG. 19 is a cross section showing a process of manufacturing a field effect transistor according to the fourth embodiment.

Next, with reference to FIG. 19, a first resist film 437 is applied onto the antireflecting film 435, exposed and developed to form a second connection hole 439.

Figure 20:
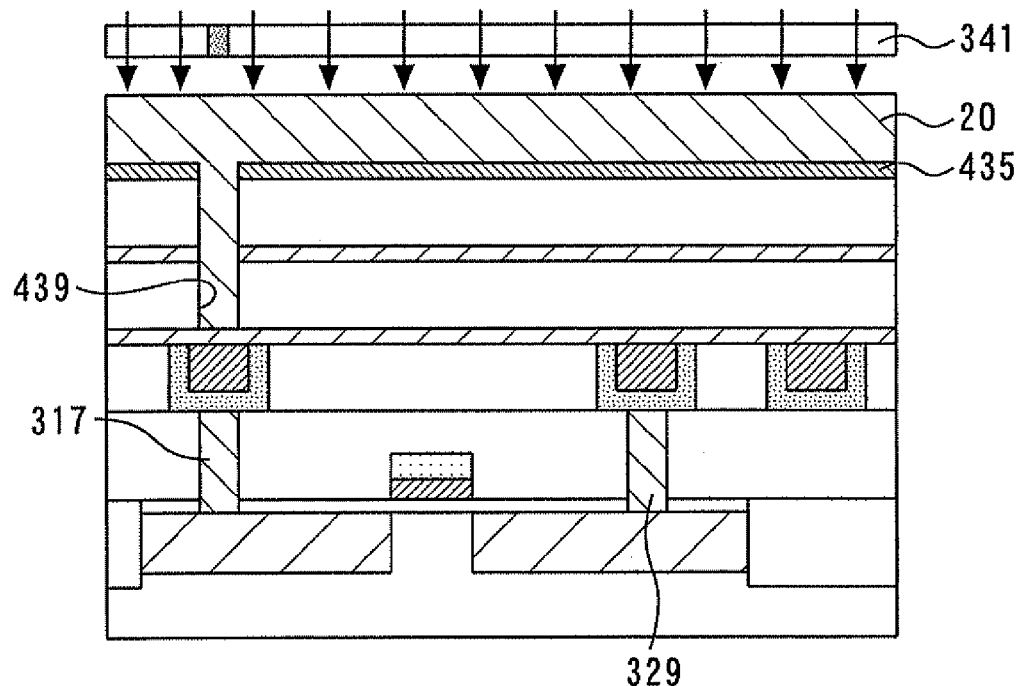
FIG. 20 is a cross section showing a process of manufacturing a field effect transistor according to the fourth embodiment.

Next, referring to FIG. 20, a positive photoresist film is applied onto the antireflecting film 435 and the second connection hole 439 is filled with the photoresist film 20 therein. A photomask 341 having a light-shielding portion smaller than the opening of the second connection hole 439 is used for exposure and development.

In this example, although the positive photoresist has been used, a negative photoresist may be applied onto and exposed and developed by use of a photomask whose light-transmitting portion is smaller in size than the opening.

Figure 21:
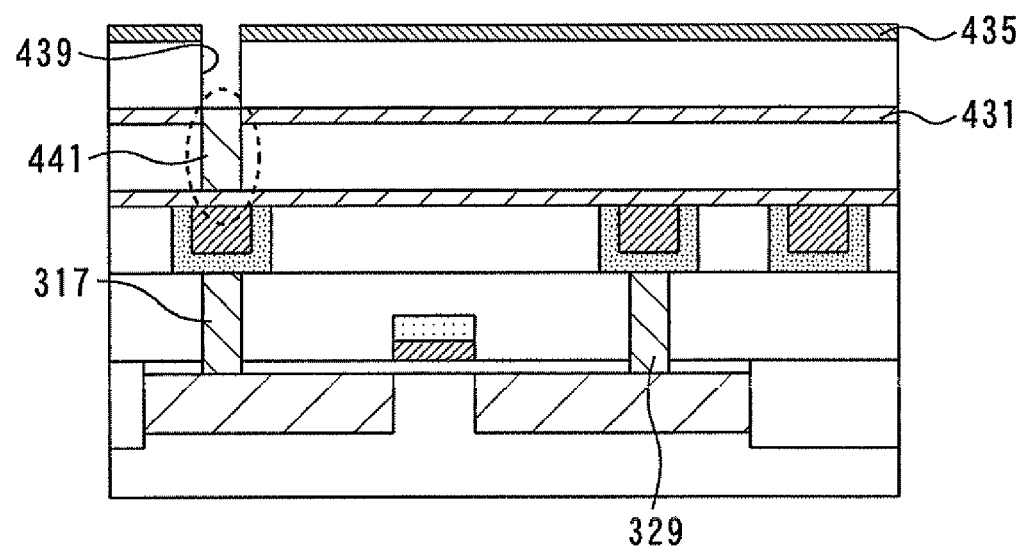
FIG. 21 is a cross section showing a process of manufacturing a field effect transistor according to the fourth embodiment.

Next, referring to FIG. 21, the resist left within the second connection hole 439 is cured to form a resist plug 441.

Figure 22:
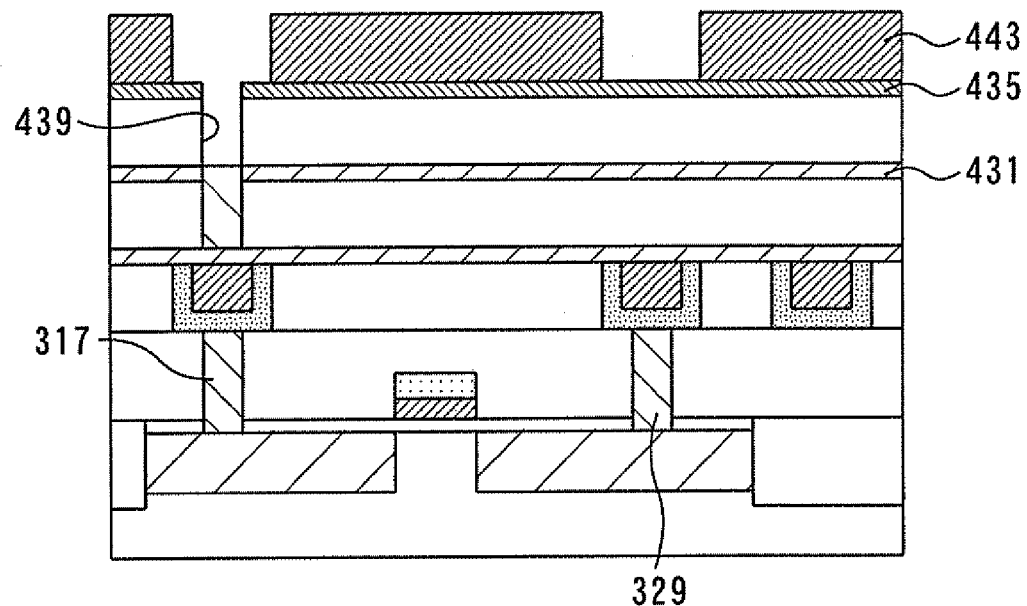
FIG. 22 is a cross section showing a process of manufacturing a field effect transistor according to the fourth embodiment.

With reference to FIG. 22, a second resist film 443 is applied onto the antireflecting film 435, followed by exposure and development for patterning in order to form a second groove and a third groove including the second connection hole 439.

Figure 23:
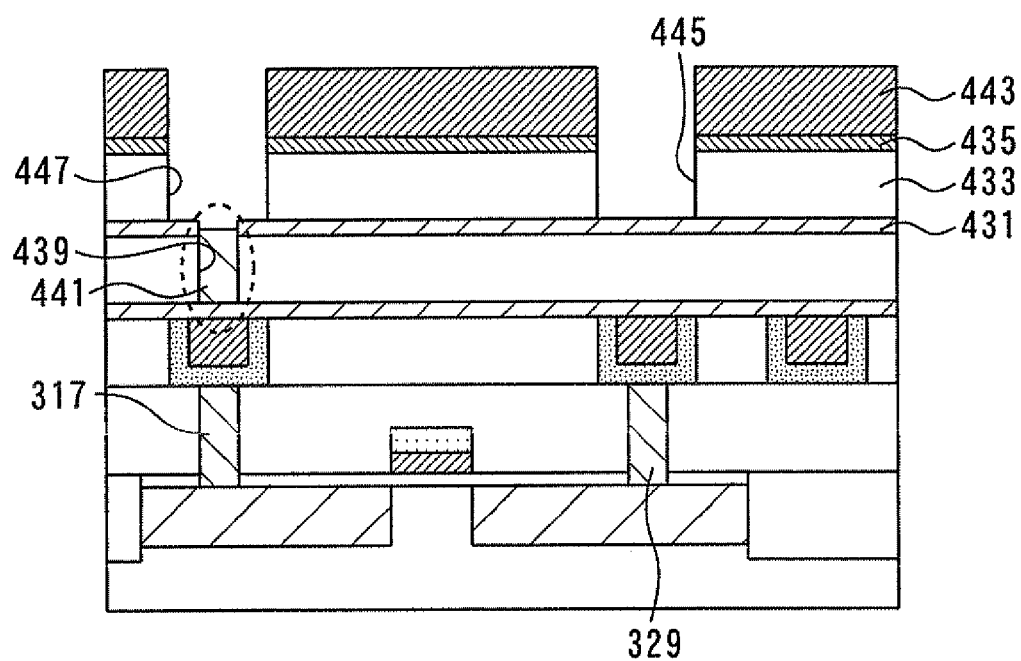
FIG. 23 is a cross section showing a process of manufacturing a field effect transistor according to the fourth embodiment.

Next, with reference to FIG. 23, using the second resist film 443 as a mask, the antireflecting film 435 is etched by a dry etching technique and the sixth insulating film 433 is also etched to the fifth insulating film 431 serving as a stopper, followed by removal of the remaining second resist film 443 by an ashing technique and a wet technique, thereby forming a second groove 445. Simultaneously, a third groove 447 is formed over the second connection hole 439 wherein the resist plug 441 has been buried.

Figure 24:
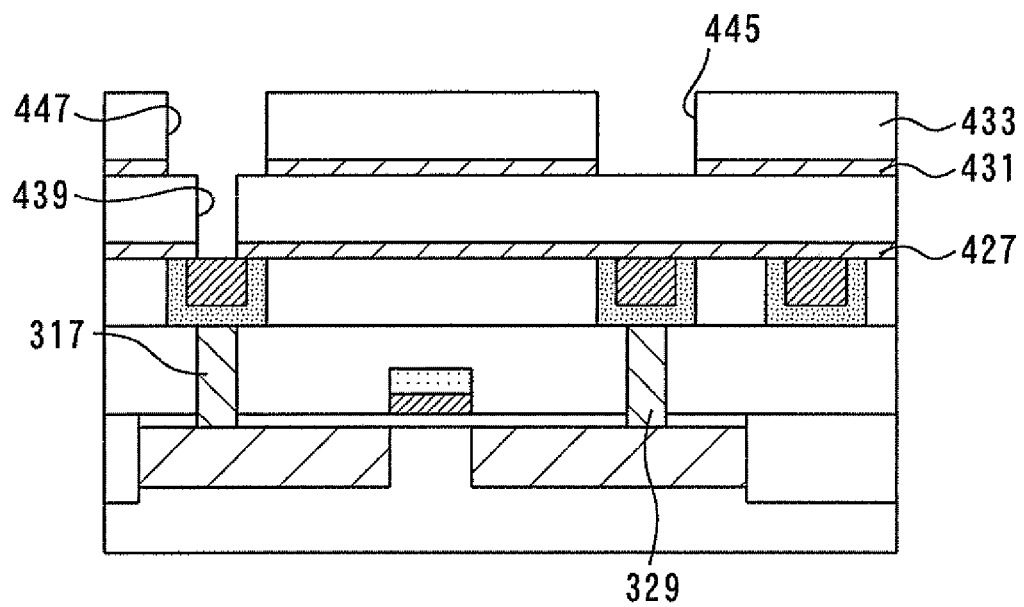
FIG. 24 is a cross section showing a process of manufacturing a field effect transistor according to the fourth embodiment.

Next, with reference to FIG. 24, the resist plug 441 in the inside of the second connection hole 439 and the second resist film 443 are removed by a dry technique, and the antireflecting film 435 is etched. The fifth insulating film 431 at the bottom of the second groove 445 and the fifth insulating film 431 around the second connection hole 439 at the bottom of the third groove 447 are, respectively, etched and the third insulating film 427 serving as a stopper at the bottom of the second connection hole 439 is etched to form a groove constituted of the second groove 445 and the third groove 447 including the second connection hole 439 and provided for the formation of a dual Damascene wiring.

Figure 25:
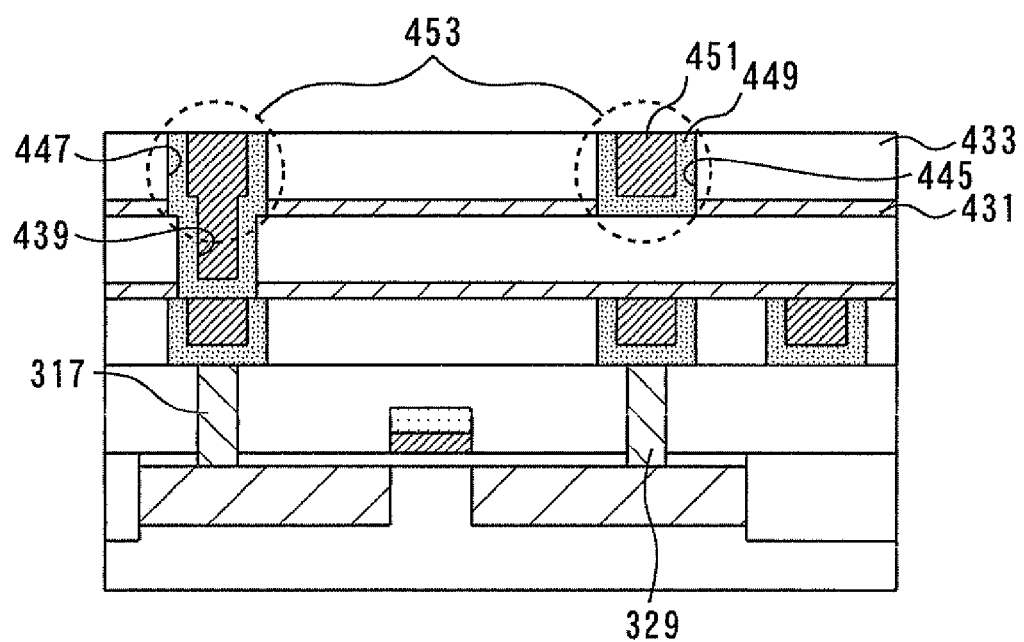
FIG. 25 is a cross section showing a process of manufacturing a field effect transistor according to the fourth embodiment.

Next, with reference to FIG. 25, a 60 nm thick TaN thin film 449 is formed by a sputtering method, at the second groove 445 and on the bottom and side walls of the third groove 447 including the second connection hole 439 and also on the sixth insulating film 433. A 1 μm thick copper thin film 451 is formed on the TaN thin film 449 by a CVD method or a plating method. Thereafter, the copper thin film 451 is polished and the TaN thin film 449 is also polished, both by a CMP method, to form a second wiring 453, which is based on a dual Damascene wiring and constituted of a multilayered wiring having the TaN thin film 449 as a lower layer and the copper thin film 451 as an upper layer, inside the second groove 445 and the third groove 447 including the second connection hole 439.

Subsequently, a given process is carried out to complete a semiconductor device.

As stated hereinabove, according to the invention relating to the fourth embodiment, when the third groove including the second connection hole is formed in the formation of the second wiring in an actual device, a resist plug is formed by use of a photomask inside the second connection hole, so that even if the opening has a small aspect ratio, it becomes possible to form a resist plug serving as a protective film at the bottom of the second connection hole.

The invention is applicable not only to a method of manufacturing a semiconductor device, but also to a method of manufacturing a device including the step of forming an opening in an interlayer film on a substrate, e.g. a method of manufacturing a liquid crystal display.

The features and advantages of the present invention may be summarized as follows.

According to one aspect, a resist film is patterned substantially in the same form as an opening of an interlayer film to bury the resist film inside the opening, so that even if the aspect ratio of the opening is small, it becomes possible to form a protective film for a subsequent step at the bottom of the opening.

According to another aspect, a film is formed on the interlayer film including the opening, a resist film is patterned substantially in the same form as the opening to bury the resist film on the film within the opening, so that even if the opening has a small aspect ratio, it becomes possible to form a protective film for protecting the film at the bottom of the opening.

According to other aspect, a positive type resist is patterned by use of a photomask whose light-shielding portion is smaller than the opening, so that the resist film at portions other than the opening can be prevented from being left.

According to other aspect, a negative type resist is patterned by use of a photomask whose light-transmitting portion is smaller than the opening, so that the resist film at portions other than the opening can be prevented from being left.

According to other aspect, a resist film is patterned substantially in the same form as the opening of the interlayer insulating film to bury the resist film in the opening, so that even if the opening has a small aspect ratio, it becomes possible to form a protective film for a subsequent step at the bottom of the opening and the interlayer film can be etched while leaving the interlayer film only at the bottom of the opening, thereby making it possible to improve the stability in yield of a semiconductor device.

According to further aspect, a film is formed on the interlayer film including the opening, and a resist film is patterned substantially in the same form as the opening of the interlayer insulating film to bury the resist film in the opening, so that even if the opening has a small aspect ratio, it becomes possible to form a protective film for protecting the film at the bottom of the opening and the film can be etched while leaving the film only at the bottom of the opening, thereby making it possible to improve the stability in yield of a semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-291823, filed on Oct. 4, 2002 including specification, claims, drawings and summary, on which the Convention priority of the present application is based, are incorporated herein by reference in its entirety.

What is claimed is:

1. A method for manufacturing a semiconductor device comprising:
   forming an interlayer film on a substrate;
   forming an opening in said interlayer film;
   applying a second film on said interlayer film, including said opening;
   applying a positive resist film on said second film; and
   patterning said resist film substantially in the same form as said opening by exposing said resist with a photomask having a light-shielding portion substantially in the same form as said opening and developing said resist to remove said resist other than the resist in the opening, thereby burying said resist film in said opening, wherein the light-shielding portion is smaller in area than said opening; and etching said second film while masking a bottom portion of said opening with said resist film buried in said opening.

2. A method for manufacturing a semiconductor device comprising:

forming an interlayer film on a substrate;

forming an opening in said interlayer film;

applying a second film on said interlayer film, including said opening;

applying a negative resist film on said second film; and patterning said resist film substantially in the same form as said opening by exposing said resist with a photomask having a light-transmitting portion substantially in the same form as said opening and developing said resist to remove said resist other than the resist in the opening, thereby burying said resist film in said opening, wherein the light-transmitting portion is smaller in area than said opening; and etching said second film while masking a bottom portion of said opening with said resist film buried in said opening.

* * * * *